(12) United States Patent
Mund et al.

(10) Patent No.: US 8,741,550 B2
(45) Date of Patent: Jun. 3, 2014

(54) BUILDING UP DIFFRACTIVE OPTICS BY STRUCTURED GLASS COATING

(75) Inventors: Dietrich Mund, Obersüßbach (DE); Klaus Michael Hammerl, Eltville (DE)

(73) Assignee: Schott AG (DE)

( * ) Notice: Subject to any disclaimer, the term of this patent is extended or adjusted under 35 U.S.C. 154(b) by 1899 days.

(21) Appl. No.: 11/570,039

(22) PCT Filed: Jun. 8, 2005

(86) PCT No.: PCT/EP2005/006140
§ 371 (c)(1),
(2), (4) Date: Jan. 21, 2009

(87) PCT Pub. No.: WO2005/121842
PCT Pub. Date: Dec. 22, 2005

(65) Prior Publication Data
US 2008/0248267 A1    Oct. 9, 2008

Related U.S. Application Data

(60) Provisional application No. 60/578,377, filed on Jun. 9, 2004.

(30) Foreign Application Priority Data

Dec. 8, 2004   (DE) .......................... 10 2004 059 252

(51) Int. Cl.
*G03F 7/20*     (2006.01)
*G02B 3/08*     (2006.01)

(52) U.S. Cl.
USPC .......................................... 430/321; 359/742

(58) Field of Classification Search
None
See application file for complete search history.

(56) References Cited

U.S. PATENT DOCUMENTS

| 4,155,627 | A | 5/1979 | Gale et al. |
| 4,944,838 | A | 7/1990 | Koch et al. |
| 5,635,423 | A | 6/1997 | Huang et al. |
| 6,593,687 | B1 | 7/2003 | Pei et al. |
| 7,825,029 | B2 * | 11/2010 | Leib et al. ..................... 438/694 |
| 2001/0046722 | A1 | 11/2001 | Tsuruma |
| 2003/0176002 | A1 | 9/2003 | Zhang et al. |

FOREIGN PATENT DOCUMENTS

| DE | 10222609 A1 | 11/2003 |
| EP | 1011028 A2 | 6/2000 |
| EP | 0477898 B1 | 5/2005 |
| JP | 58172679 | 10/1983 |
| JP | 62-066204 A * | 3/1987 |
| JP | 2000-056111 A * | 2/2000 |
| WO | 00/16134 A1 | 3/2000 |
| WO | WO03/088340 A2 * | 10/2003 |

OTHER PUBLICATIONS

Computer-generated translation of JP 2000-056111 (Feb. 2000).*
Zhou Xiaoxiang, "CN Application No. 200580018841.4 Office Action Aug. 12, 2011", , Publisher: SIPO, Published in: CN.
European Office Action, dated May 14, 2012 of European Patent Application No. 05751731.8.

* cited by examiner

*Primary Examiner* — John A. McPherson
(74) *Attorney, Agent, or Firm* — Kaplan Breyer Schwarz & Ottesen, LLP

(57) ABSTRACT

The invention relates to optical parts, and in particular to a process for applying an optically active structuring to a substrate, and also to a component produced using a process of this type. The process for applying an optically active structuring to a substrate comprises in particular photolithographic techniques and the deposition of material via physical vapor deposition processes.

22 Claims, 12 Drawing Sheets

BUILDING UP DIFFRACTIVE OPTICS BY STRUCTURED GLASS COATING

DESCRIPTION

The invention relates in general terms to optical parts, and in particular to a process for applying an optically active structuring to a substrate, to an optically active element comprising an optically active structure, preferably a focusing structure and also to a component produced using a process of this type.

For instance, US-A1-2003/0176002 describes a method for the fabrication of optical waveguides whereby lift-off, rather than etching, is used to pattern the waveguide core. The document EP-B1-0477898 shows the production of quartz optical waveguides by a combined method of glass film formation by a flame hydrolysis deposition (FHD) and fine processing of the formed glass film by reactive ion etching (RIE). US-B1-6593687 relates to an electroluminescent device and a method for its production. Such devices are constructed in a multilayer thin-film or "sandwich" configuration comprising a layer of electroluminescent material interposed between electron-injection and hole-injection electrode layers.

As an example in JP 62066204 A it is disclosed a Fresnel lens and its manufacture. The lens is obtained in which thin films are successively laminated on a substrate such that the type of Fresnel lens is obtained. Since the production of optical structure requires a precise lamination in each layer without disturbing the optical properties of the resulting lens structure, this is a time and cost consuming procedure.

As another example, in JP 62066204 A a Fresnel lens and its manufacture is disclosed. The lens is obtained in which thin films are successively laminated on a substrate such that the type of Fresnel lens is obtained. Since the production of optical structure requires a precise lamination in each layer without disturbing the optical properties of the resulting lens structure, this is a time and cost consuming procedure.

DE 43 38 969 C2 discloses a process for manufacturing inorganic diffractive elements, in particular by glass by etching. A substrate is coated with a mask covering the areas not to be etched, said mask being resistant to the etching medium and corresponding to the relief structure to be created, the desired relief is subsequently created in the areas of the substrate not covered by the mask by means of an etching process and the mask is subsequently removed, if necessary. Since especially for glasses only a low etching rate is achievable, this is also a time and cost consuming procedure.

Therefore, the object of the invention is to provide a way of improving the production of optical elements, in particular diffractive optical elements, and to provide improved optically active elements.

GENERAL DESCRIPTION OF THE INVENTION

This object is achieved in an amazingly simple way by a process, an optically active element and, component and a hybrid lens in accordance with the independent claims. Advantageous refinements form the subject matter of the respective subclaims.

The process for applying an optically active structuring to a substrate according to the present invention comprises a structuring using photolithographic masks with the steps of
  coating the substrate with a photosensitive resist layer,
  photolithographic structuring of the applied layer,
  coating the pre-structured substrate with an optically active layer which comprises materials selected from the group at least consisting of glass and metal, by E-beam PVD (electron beam physical vapor deposition), and
  lifting off the resist layer.

Said coating method respectively deposition method of the optically active layer provides a fast way to form said optically active layer because high vapor deposition rates of at most 4 μm/min are achievable which exceeds known sputtering rates by a multiple and makes the use of this process for the application described above of considerable interest. Possible materials, in particular possible glass materials, for the coating with the optically active layer are presented in the following figure description section.

Moreover precisely defined structures are able to be formed both in horizontal and vertical direction with respect to the surface respectively the side of said substrate. Suitable selection of the vapor deposition parameters of a glass, which is preferably used with set optical and thermomechanical properties in this way, makes it possible to apply structured glass layers with a thickness of between 0.1 μm and at most 1 mm.

Another advantage of the evaporation deposition beside a high deposition rate is a lower thermal stress of the substrate which enables the possibility of using a photo resist to form the first coating. The step of coating the substrate is carried out by spin coating, spraying, electrodeposition and/or by depositing of at least one photosensitive resist foil. The step of lifting off the resist layer is carried out in such a manner that at least one layer that has been applied to the resist layer is also lifted off. Further the photolithographic structuring step comprises mask exposure and subsequent developing.

In an embodiment the coating step comprises the coating of the pre-structured substrate with an optically active layer by E-beam PIAD processes. In this type of process, an additional ion beam is directed on the substrate which is to be covered. Said ion beam induces the release of the loosely bound particles on the substrate surface which finally leads to a dense and defect reduced layer respectively optically active layer on the substrate.

By changing the orientation of the substrate with respect to the source of coating it is possible to coat several sides of the substrate which allows the fabrication of sophisticated optically active element or components. In particular said optically active structuring is applied onto a bottom side of said substrate and/or a top side of said substrate and/or onto at least one side face of said substrate. Possible substrate materials are described in the following figure description section.

Dependent on the component or the optically active element to form the above described process can involve in one embodiment only a single repetition of
  coating of the substrate with a photosensitive resist layer,
  photolithographic structuring of the applied layer,
  coating of the pre-structured substrate with an optically active layer which comprises materials selected from the group at least consisting of glass and metal, by E-beam PVD (electron beam physical vapor deposition),
  and lifting off of the resist layer.

Dependent on the desired respectively needed optical properties of the optically active element, e.g. its refraction index, the optically active layer could be applied such that the optically active layer comprises a constant layer composition and/or a varying layer composition along a direction perpendicular to a substrate surface and/or along a direction parallel to the substrate surface. Further details in relation to the varying layer composition are presented in the section of the figure description.

In a particular embodiment the above described process is characterized respectively performed by a number of repetitions of coating of the substrate with a photosensitive resist layer,
photolithographic structuring of the applied layer,
coating of the pre-structured substrate with an optically active layer which comprises materials selected from the group at least consisting of glass and metal, by E-beam PVD (electron beam physical vapor deposition),
and lifting off of the resist layer.

The optically active first layer has a thickness of between around 0.1 µm and at most around 1 mm. Dependent on the structure of the optically active first layer, i.e. the optically active first layer is formed by at least one structure, each structure of the optically active first layer has a width of smaller than around 50 µm, preferably smaller than around 20 µm, particular preferred smaller than around 10 µm. Dependent on the appearance of the optically active first layer, e.g. to form a Fresnel lens or a Fresnel lens type, a combination of structures of different widths is necessary. This is described in more detail in the following figure description section.

As already described, dependent on the desired respectively needed optical properties of the optically active element, e.g. its refraction index, the coating of the pre-structured substrate with an optically active layer comprises in each layer the same material or different materials. Further the optically active layer could be applied such that the optically active layer comprises a varying layer composition along a direction perpendicular to a substrate surface and/or along a direction parallel to the substrate surface.

In one embodiment, the optically active layer is produced using coating materials made from glass using PVD processes wherein in particular said optically active layer is applied with the aid of electron beam evaporation in the PVD process. Furthermore said optically active layer could be also applied with the aid of electron beam evaporation in the PIAD process.

Beside the above described process the present invention is furthermore related to an optically active element comprising a substrate and at least one optically active first layer provided on said substrate wherein the first layer is formed of at least one material selected from glass or metal and has an optically active structure, preferably a focusing structure.

Said optically active first layer is applied onto a bottom side of said substrate and/or onto a top side of said substrate. In one embodiment the optically active first layer comprises a varying material composition along a direction perpendicular to the substrate surface and/or along a direction parallel to the substrate surface.

To provide elaborated optically active elements, e.g. a Frensel lens respectively a Fresnel lens type, or optical structures on a substrate, said optically active elements is provided with an array of several optically active layers in which the array of several optically active layers comprise in each optically active layer the same material or different materials.

The optically active structure of the optically active element is characterized by its fabrication using a process comprising structuring using photolithographic masks with the steps of coating the substrate with a photosensitive resist layer,
photolithographic structuring of the applied layer,
coating the pre-structured substrate with an optically active layer which comprises materials selected from the group at least consisting of glass and metal, by E-beam PVD (electron beam physical vapor deposition), and
lifting off the resist layer.

The coating of the substrate is applied by spin coating, spraying, electrodeposition and/or by depositing of at least one photosensitive resist foil. The lifting off of the resist layer is carried out in such a manner that at least one layer that has been applied to the resist layer is also lifted off.

On the optically active element the coating of the pre-structured substrate with an optically active layer is applied by E-beam PIAD processes. The photolithographic structuring comprises mask exposure and subsequent developing.

Dependent on the desired properties the optically active element is produced in a single repetition of coating of the substrate with a photosensitive resist layer,
photolithographic structuring of the applied layer,
coating of the pre-structured substrate with an optically active layer which comprises materials selected from the group at least consisting of glass and metal, by E-beam PVD (electron beam physical vapor deposition),
and lifting off of the resist layer or in a further embodiment it is produced by a number of repetitions of coating of the substrate with a photosensitive resist layer,
photolithographic structuring of the applied layer,
coating of the pre-structured substrate with an optically active layer which comprises materials selected from the group at least consisting of glass and metal, by E-beam PVD (electron beam physical vapor deposition),
and lifting off of the resist layer.

The optically active layer is produced using coating materials made from glass using PVD processes wherein particularly the optically active layer is applied with the aid of electron beam evaporation in the PVD process. In a further embodiment the optically active layer is applied with the aid of electron beam evaporation in the PIAD process.

Preferably the optically active element is or comprises a Fresnel lens and/or a Fresnel lens type.

Further the invention comprises a component having an optically active, preferably focusing structure formed from glass and/or metal, in which the structure is produced by a process having the features of process as described above. Also synthetic materials, in particular transparent synthetic materials, could be used.

Furthermore the invention comprises a component having an optically active, preferably focusing structure formed from glass and/or metal, in which the structure is producibly by a process having the features of process as described above. Preferably the component is or comprises a Fresnel lens and/or a Fresnel lens type.

Moreover the invention comprises also a hybrid lens having a substrate and an optically active, preferably focusing structure, which is produced using the process as described above.

The invention is explained in more detail below on the basis of preferred embodiments and with reference to the appended figures. The features of the different embodiments are able to be combined with one another. Identical reference numerals in the figures denote identical or similar parts.

Figure 1A:
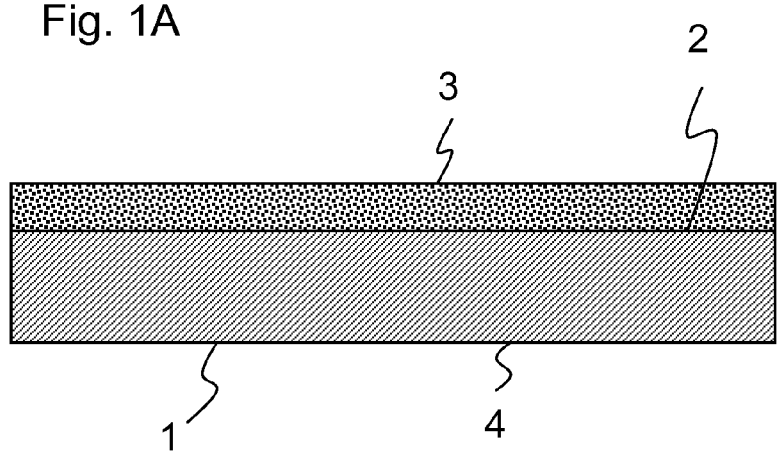
FIGS. 1A to 1E use diagrammatic cross-sectional views to illustrate the process steps involved in the structured coating of substrates.

The following text refers first of all to FIGS. 1A to 1E, which use diagrammatic cross-sectional views to illustrate the process steps involved in producing a structured substrate in accordance with a first embodiment of the invention. To produce a structured coating, first of all a first coating 3 is applied to the substrate 1 on the surface 2 which is to be coated, as shown in FIG. 1A. The substrate 1 is preferably joined to further substrates in a wafer assembly. The first coating 3 is preferably formed as a photosensitive resist layer. The substrate comprises at least one of the materials selected from the group consisting of glass, ceramic, semiconductor material, in particular silicon, semiconductor compound, metal, metal alloy, plastic or a combination of the before mentioned materials.

Figure 1B:
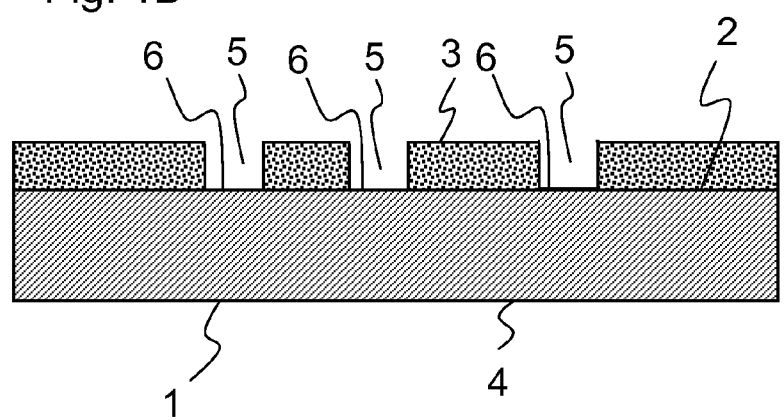

FIG. 1B shows a cross-sectional view through the substrate following a further process step. In this step, structures have been introduced into the first coating 3. These structures create a negative structuring 5 which, when seen in plan view, is complementary to the final structured coating. The structuring has been carried out in such a way that regions 6 of that surface 2 of the substrate 1 which is to be coated have been uncovered.

The structuring may preferably be carried out photolithographically, for which purpose the first coating 3 comprises, for example, a photoresist into which the negative structuring 5 has then been introduced by exposure and developing.

The first coating 3 of the substrate 1, in particular the coating with a photosensitive resist layer, e.g. a photosensitive varnish, is applied by spin coating, spraying, electrodeposition and/or by depositing a photosensitive resist foil. A further possibility to form a negative structuring 5 is the coating by a structured print process, e.g. serigraphy or ink jet printing.

Figure 1C:
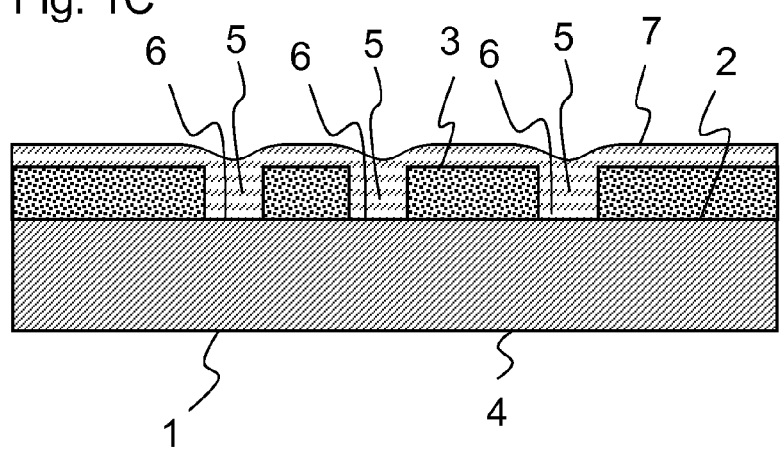

FIG. 1C shows the substrate after the step of depositing a layer 7 with a vitreous structure, in particular an optically active layer, on that surface 2 of the substrate 1 which has been provided with the first coating 3. The layer 7 preferably comprises a metal or a vapor-deposition glass, with the deposition being effected by means of electron beam evaporation coating onto the substrate 1 coated with the first coating 3 comprising a negative structuring 5. The layer 7 covers the uncovered regions 6 and the layer 3.

According to a refinement of the invention, the deposition of the layer 7 may also be effected by plasma ion assisted deposition, in order to obtain a particularly dense and defect-free layer. According to the present invention, metal layers can also advantageously be applied by PVD, PICVD or by electroplating processes.

The vapor-deposition glass which has the following composition, in percent by weight, has proven particularly advantageous:

| Components | % by weight |
|---|---|
| $SiO_2$ | 75-85 |
| $B_2O_3$ | 10-15 |
| $Na_2O$ | 1-5 |
| $Li_2O$ | 0.1-1 |
| $K_2O$ | 0.1-1 |
| $Al_2O_3$ | 1-5 |

A preferred vapor-deposition glass of this type is the glass 8329 produced by Schott having the following composition:

| | | |
|---|---|---|
| $SiO_2$ | 84.1% | |
| $B_2O_3$ | 11.0% | |
| $Na_2O$ | ≈2.0% | |
| $K_2O$ | ≈0.3% | (in the layer ⇒ 3.3%) |
| $Li_2O$ | ≈0.3% | |
| $Al_2O_3$ | ≈2.6% | (in the layer < 0.5%) |

The electrical resistance is approximately $10^{10}$ Ω/cm (at 100° C.). Furthermore, in its pure form this glass has a refractive index of approximately 1.470.

The dielectric constant ∈ is approximately 4.7 (at 25° C., 1 MHz), tan δ is approximately $45 \times 10^{-4}$ (at 25° C., 1 MHz). The vapor deposition process and the differing volatility of the components of this system produce slightly different stoichiometries between the target material and the deposited layer. The deviations in the deposited layer are indicated in parentheses.

A further group of suitable vapor-deposition glasses has the following composition, in percent by weight:

| Components | % by weight |
|---|---|
| $SiO_2$ | 65-75 |
| $B_2O_3$ | 20-30 |
| $Na_2O$ | 0.1-1 |
| $Li_2O$ | 0.1-1 |
| $K_2O$ | 0.5-5 |
| $Al_2O_3$ | 0.5-5 |

A preferred vapor-deposition glass from this group is the glass G018-189 produced by Schott and having the following composition:

| Components: | % by weight |
|---|---|
| $SiO_2$ | 71 |
| $B_2O_3$ | 26 |
| $Na_2O$ | 0.5 |
| $Li_2O$ | 0.5 |
| $K_2O$ | 1.0 |
| $Al_2O_3$ | 1.0 |

The glasses which are preferably used in particular have the properties listed in the table below:

| Properties | 8329 | G018 - 189 |
|---|---|---|
| $\alpha_{20\text{-}300}$ [$10^{-6}K^{-1}$] | 2.75 | 3.2 |
| Density (g/cm$^3$) | 2.201 | 2.12 |
| Transformation point [° C.] | 562 | 742 |
| Refractive index nd | 1.469 | 1.465 |
| Hydrolytic resistance class according to ISO 719 | 1 | 2 |
| Acid resistance class according to DIN 12 116 | 1 | 2 |
| Alkali resistance class according to DIN 52322 | 2 | 3 |
| Dielectric constant $\epsilon$ (25° C.) | 4.7 (1 MHz) | 3.9 (40 GHz) |
| tan$\delta$ (25° C.) | $45 * 10^{-4}$ (1 MHz) | $26 * 10^{-4}$ (40 GHz) |

The selection of glasses presented above is exemplary and not restricted to the mentioned glasses.

Advantageously the layer 7 is formed by a material originating from only one source. For this reason a large reproducibility of the layer 7 could be achieved. Moreover unintentional modifications of the layer stoichiometry using several sources could be avoided.

According to a another refinement of the invention, the deposition of the layer 7 may also be effected by using at least two sources. The deposition is steered by an adaptable covering of each source to control the fraction of each source composition to the composition of the deposited layer 7.

The application of at least two sources advantageously enables the fabrication of a layer having a varying layer composition both along a direction perpendicular to a substrate surface and/or along a direction parallel to the substrate surface.

This layer composition variation could be also achieved by varying the operation parameters of one source or by combining different deposition processes. These processes comprise for example physical vapor deposition, in particular electron beam evaporation or sputtering, chemical vapor deposition or plasma induced chemical vapor deposition.

In this manner the material properties as e.g. the temperature coefficient or the optical properties, e.g. the index of refraction respectively the Abbe coefficient, could be adapted to the intended purpose.

Figure 1D:
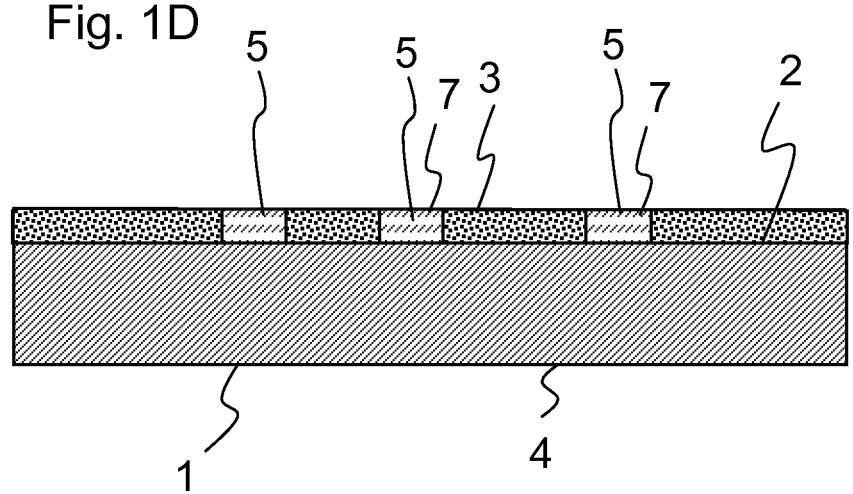

FIG. 1D shows the substrate after the subsequent step of uncovering the first coating 3. In this variant of the process, the coating was uncovered by planarizing the coated surface. For this purpose, the coated surface was plane-ground until the layer 7 on the first coating had been removed so that the first coating 3 beneath it is uncovered again and thereby made accessible.

Figure 1E:
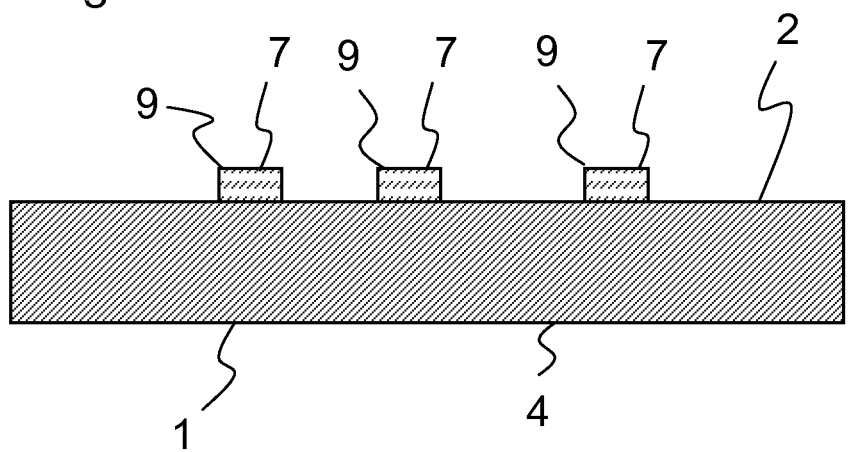

FIG. 1E shows a subsequent process step in which the first coating 3 has been removed. On account of the vapor deposition of the layer 7 on the negative structuring of the first coating 3 and the removal of the first coating 3 after it has been uncovered, a positively structured layer 7 ultimately remains on the substrate. The structures 9 of the positively structured layer 7 cover the regions 6 which were initially uncovered or not covered by the first coating 3.

The removal of the negatively structured first coating 3 may be effected, for example, by dissolution in a suitable solvent or by wet-chemical or dry-chemical etching. Incineration or oxidation in an oxygen plasma may advantageously also be used to remove the coating.

The positively structured layer 7 comprises one structure 9 or several structures 9. According to the invention said structures 9 can comprise different materials, different compositions along a direction perpendicular to a substrate surface and/or along a direction parallel to the substrate surface, different optical properties, different dimensions, i.e. different diameters, widths or heights respectively thickness, or different geometries, i.e. different shapes, from one to another.

The process according to the present invention is applicable to the fabrication of optical elements having a large variety of different properties and/or of different dimensions.

Said structure 9 respectively structures 9 of the positively structured layer 7 comprises a height respectively thickness of about 0.1 μm up to 1 mm and a diameter respectively width in the order of smaller than 500 μm, 200 μm, 100 μm, 50 μm, 20 μm and/or 10 μm.

In another embodiment also at least two different materials could be deposited as a layer 7 to form the structure 9 of the positively structured layer 7. I.e. each structure 9 of the positively structured layer 7 could comprise another material according to the intended properties, in particular to the optical properties.

The combination of at least two glasses comprising different optical properties enables the correction of the chromatic aberration of an optical system. According to the present invention said combination could be achieved by combining the at least two materials in one layer or combining the at least two materials in different, in particular sandwiched, layers.

Figure 2A:
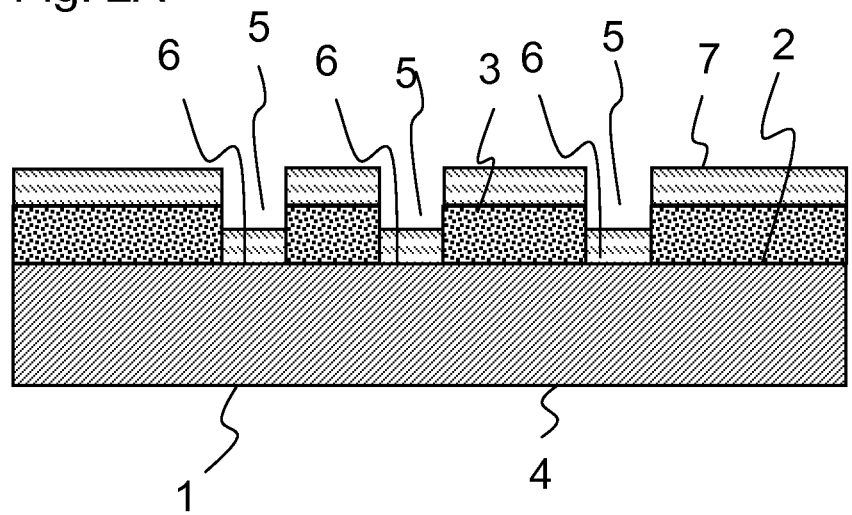
FIGS. 2A and 2B show a variant on the process steps illustrated with reference to FIGS. 1C to 1E, FIGS. 3A to 3C use diagrammatic cross-sectional views to illustrate an advantageous embodiment of process steps involved in the structured coating of a substrate.
Figure 2B:
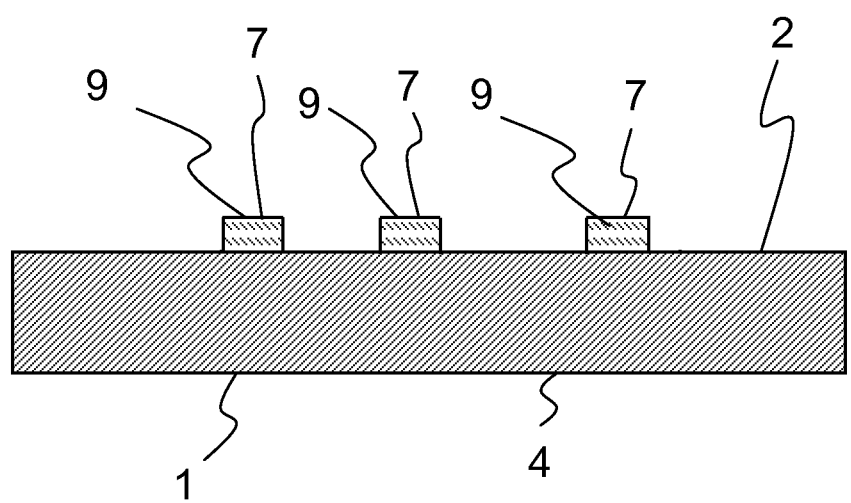

The following text refers to FIGS. 2A and 2B to explain a preferred variant on the process steps shown with reference to FIGS. 1D and 1E. In this variant of the process, first of all the substrate 1 is prepared by application of a structured first coating 3, as has been shown with reference to FIGS. 1A and 1B. The first coating 3 once again has a negative structuring 5, formed such that common lift off techniques could be applied, which leave regions 6 of the first surface 2 uncovered. Once again, a layer 7 is deposited on the surface of the substrate which has been prepared in this way; this deposition is effected, for example, by vapor deposition of a vapor-deposition glass or by deposition of a metal layer. However, the layer thickness of the layer 7 is in this case not selected to be so great as to completely enclose the layer 7. This is achieved by selecting a layer thickness for the layer 7 which is less than the layer thickness of the first coating 3. This phase of the process is shown in FIG. 2A.

The first coating 3 can then be removed directly without any uncovering, for example by means of the planarization shown with reference to FIG. 1C, being required, since the fact that the layer 7 does not form completely continuous coverage means that access to the first coating 3 is retained. Those regions of the layer 7 which are located on the first coating 3 are lifted off during the removal of the first coating 3 and are thereby removed. The result which remains is once again, as shown in FIG. 2B, a structured coating respectively layer 7 with positive structures 9.

According to the invention the production of the positively structured layer 7 can be performed on at least one side of the substrate 1, in particular on the top side 2 of the substrate 1 and/or on the bottom side 4 of the substrate 1.

In particular for the production of sophisticated optical elements respectively optically active elements, e.g. a Fresnel lens, the process steps described above may particularly advantageously also be carried out a number of times, so that it is possible to produce a multilayer structuring.

The layers which form said multilayer structuring comprise the same properties as the layer 7 described above. In particular each layer can comprise a different material which has different, in particular different optical, properties.

Figure 3A:
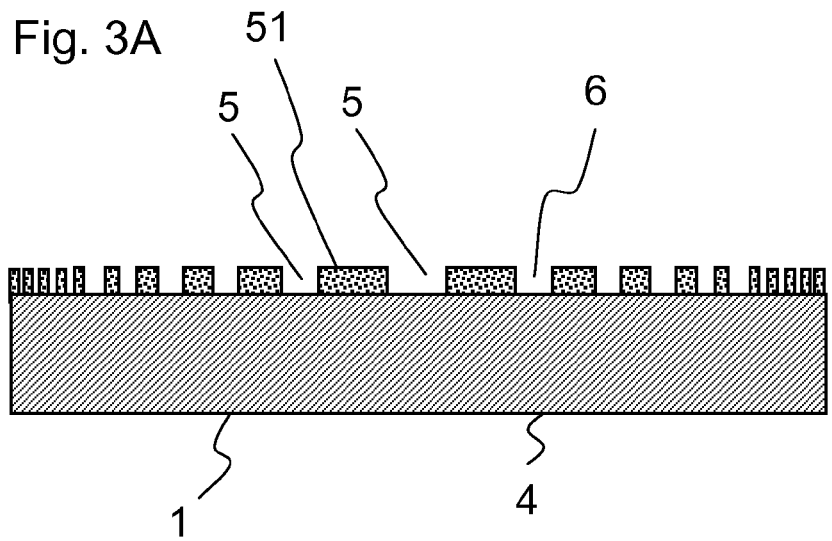

FIG. 3A shows an intermediate stage of the process similar to FIG. 1B for a particularly preferred embodiment. The figure illustrates the negative structuring 5 used to produce a Fresnel lens with uncovered regions 6 and regions 51 in which the substrate has been coated, for example with photoresist.

Figure 4:
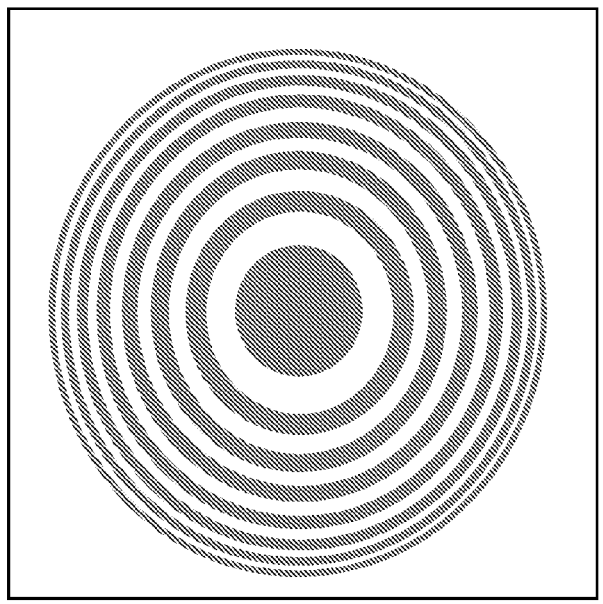
FIG. 4 shows a diagrammatic plan view of an advantageous embodiment of a component according to the invention.

The negative structuring 5 used to produce a Fresnel lens comprises a central circular shaped uncovered region surrounded by concentric ring area shaped uncovered regions (for illustration see FIG. 4). Said ring area shaped uncovered regions are defined by an area which is limited by two concentric circles of different radii, a smaller radius r1 and larger radius r2, resulting in a width w=r2−r1. With increasing radius, respectively increasing r1 and r2, the width w of the ring areas and the distance d between the two neighbouring ring areas are decreasing in size.

The process according to the present invention is applicable to the fabrication of Fresnel lenses or Fresnel type lenses having a large variety of different dimensions. Said negative structuring 5 has a height of about 0.1 μm up to 10 mm. Said central circular shaped uncovered region has a diameter in the order of smaller than 500 μm, 200 μm, 100 μm, 50 μm, 20 μm or 10 μm. The width w of said ring areas and the distance d between the ring areas comprise a value of about smaller than 500 μm, 200 μm, 100 μm, 50 μm, 20 μm and/or 10 μm.

Figure 3B:
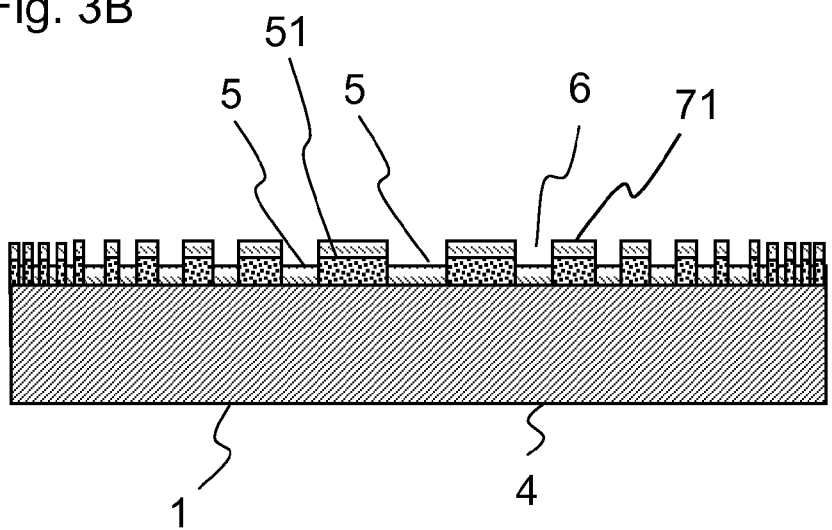
Figure 3C:
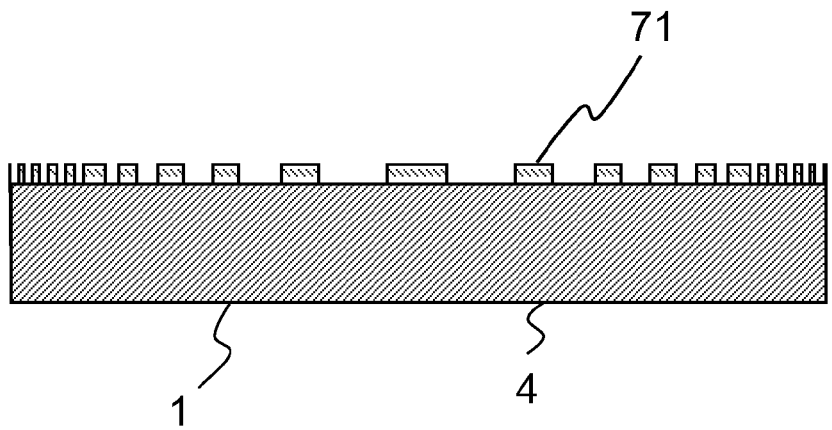

FIGS. 3B and 3C show process steps similar to those illustrated in FIGS. 2A and 2B to form an optical element embodiment respectively an optically active elements, in which an optically active layer 71 is applied to the entire surface. By means of a lift-off process, the resist layer regions 51 together with the regions of the optically active layer 71 located thereon are in turn lifted off, and what remains is optically active regions 71 which form the positive structuring.

The widths of the positive structuring, respectively the dimensions of the optically active layer 71 corresponds to the widths of the uncovered regions. The height of the optically active layer 71 is limited respectively defined by the height respectively the thickness of the negative structuring 5 and has a value in the order of 0.1 μm up to 1 mm.

The structuring of the Fresnel lens illustrated in FIG. 3C over the surface is illustrated in FIG. 4.

Figure 5:
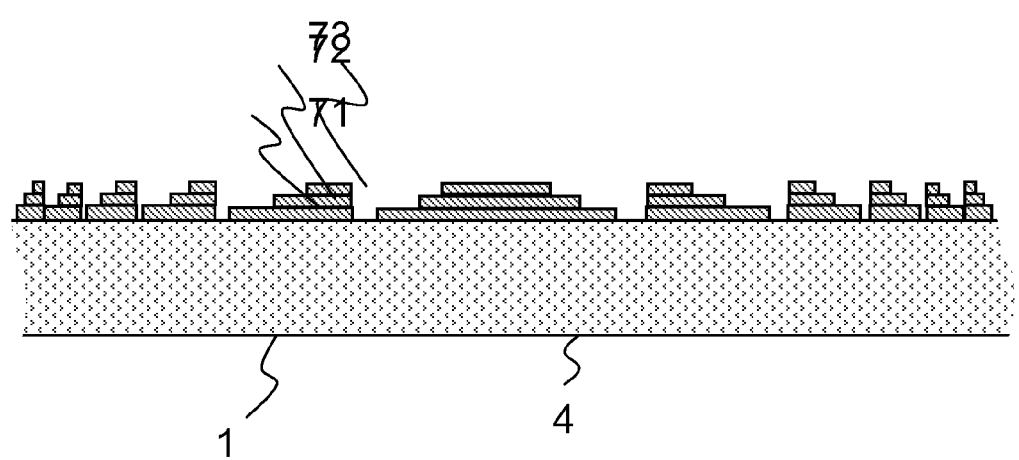
FIG. 5 shows an embodiment of a substrate which has been coated with a plurality of layers.

In particular for the production of Fresnel lenses, the process steps described above may particularly advantageously also be carried out a number of times, so that it is possible to produce a multilayer structuring. This is illustrated in FIG. 5, which shows a cross-sectional view through a multilayer Fresnel lens. In this exemplary embodiment, three differently designed layers, a first layer 71, a second layer 72 and a third layer 73 have been applied. As illustrated in FIG. 5, by stepwise decreasing the width of the first layer 71 structures to the top layer structures, here the third layer 73 structures, it is possible to generate a saw tooth type morphology respectively a serrated structure and/or a convex typed structure. In particular, both by decreasing the thickness of each layer and increasing the number of layers, it is possible to obtain a well defined saw tooth type morphology respectively a well defined serrated structure and/or a well defined convex typed structure.

To produce a structured coating, first of all a first coating 3 is applied to the substrate 1 on the surface 2 which is to be coated, as shown in FIG. 1A. The first coating 3 is preferably formed as a photosensitive resist layer.

The structured first coating 3 to finally generate the positive structures of the first layer 71 comprises a photosensitive resist layer which is applied preferentially by spin coating.

The second structured coating to finally generate the positive structures of the second layer 72 comprises also a photosensitive resist layer which is applied preferentially by spraying. Further coatings to generate further positively structured layers are also preferentially applied by spraying. In particular said first layer 71, said second layer 72 and/or said third layer 73 comprise an optically active layer.

FIGS. 6 to 11 show further optical element embodiments respectively optically active elements embodiments of a Fresnel lens respectively a Fresnel lens type. As for the Fresnel lens of FIG. 5, the process steps described above are particularly advantageously carried out a number of times to produce a multilayer structuring. Each layer of the multilayer structuring described in FIGS. 6 to 11 comprises in particular an optically active layer.

Figure 6:
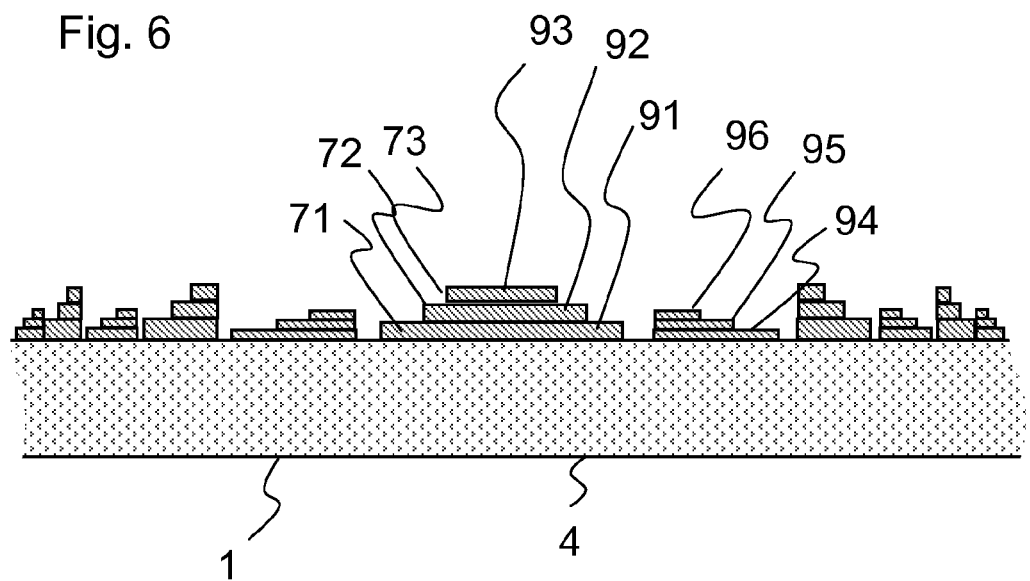
FIG. 6 shows an embodiment of a substrate which has been coated with a plurality of layers having different heights.
Figure 7:
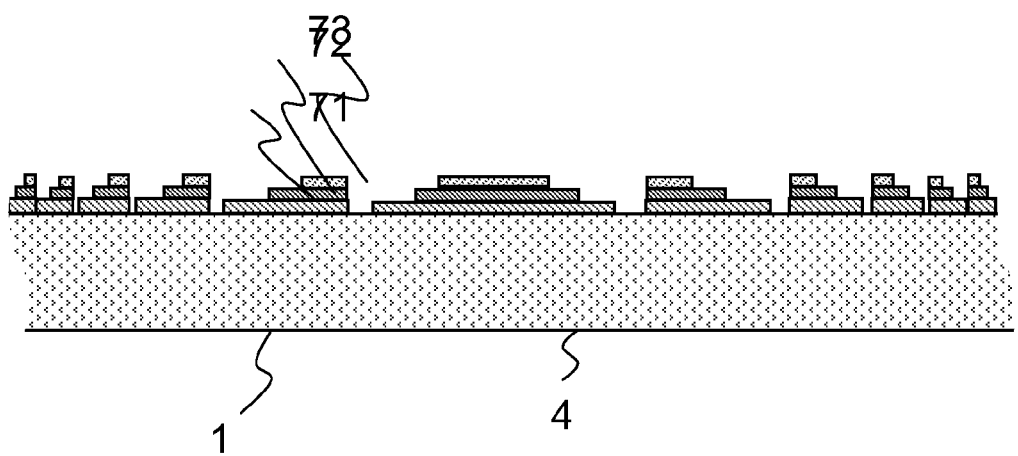
FIG. 7 shows an embodiment of a substrate which has been coated with a plurality of layers comprising different materials, in particular alternating in layers.
Figure 8:
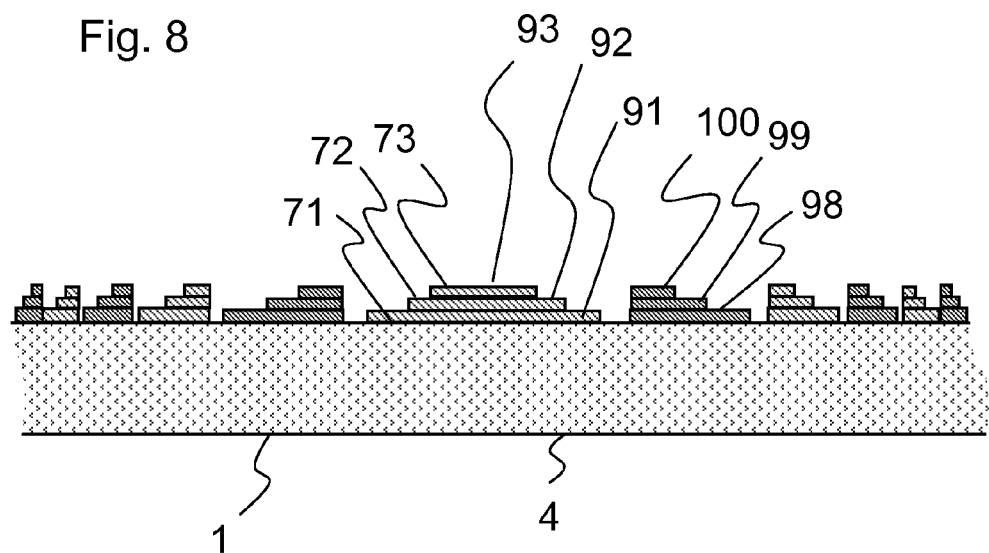
FIG. 8 shows an embodiment of a substrate which has been coated with a plurality of layers comprising a positive structuring of different materials, in particular alternating in structures.

Exemplary the embodiments illustrated in FIGS. 6 to 8 show a three layer system comprising a first layer 71, a second layer 72 and a third layer 73 which are placed on the top side 2 of the substrate 1.

FIG. 6 illustrates a three layer system 71, 72, 73 wherein the positive structures 91, 92, 93, 94, 95, 96 of each layer comprise different heights. In detail, in the first layer 71 the positive structure 94 has a lower height than the positive structure 91, in the second layer 72 the positive structure 95 has a lower height than the positive structure 92 and in the third layer 73 the positive structure 96 has a lower height than the positive structure 93. In particular the height of the positive structures in each layer is alternating for neighbored positive structures.

FIG. 7 shows a system wherein the layers 71, 72, 73 comprises different materials. In detail, the first layer 71 comprises a first material, the second layer 72 comprises a second material and the third layer 73 comprises a third material.

FIG. 8 explains by example a three layer system 71, 72, 73 wherein the layers 71, 72, 73 and the positive structures 91, 92, 93, 98, 99, 100 comprise different materials, in particular the material of the positive structures 91, 92, 93, 98, 99, 100 is alternating. In detail, the positive structure 91, 92, 93 comprises in each layer 71, 72, 73 the same first material and the positive structure 98, 99, 100 comprises in each layer 71, 72, 73 the same second material.

Figure 9:
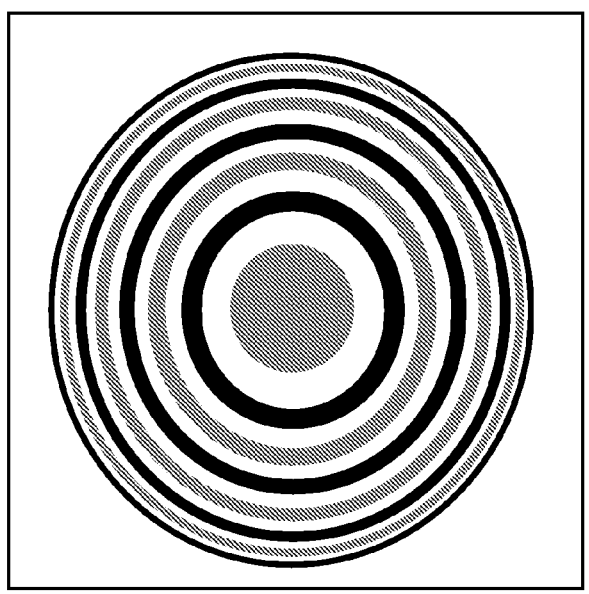
FIG. 9 shows a schematic plan view of FIG. 8, FIGS. 10 and 11 show further embodiments of a substrate which have been coated with a plurality of layers on the top side and on the bottom side of the substrate.

The structuring of the Fresnel lens respectively the Fresnel lens type illustrated in FIG. 8 over the surface is illustrated in FIG. 9.

Figure 10:
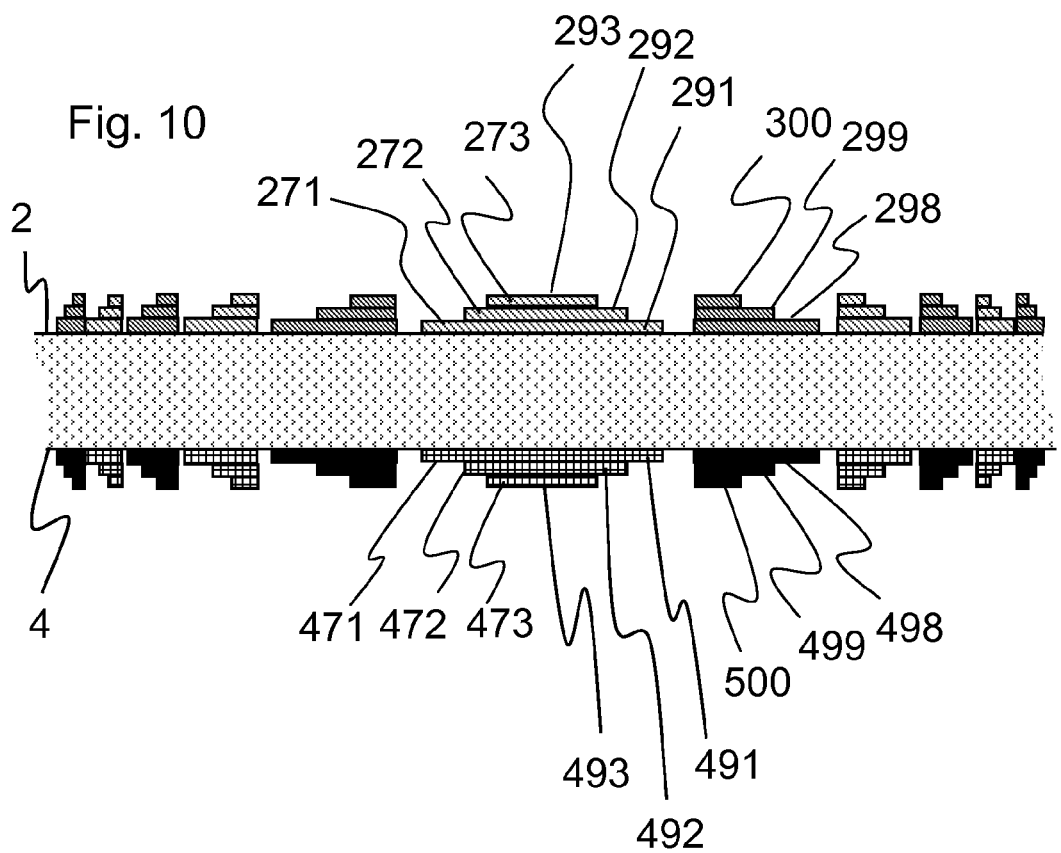
Figure 11:
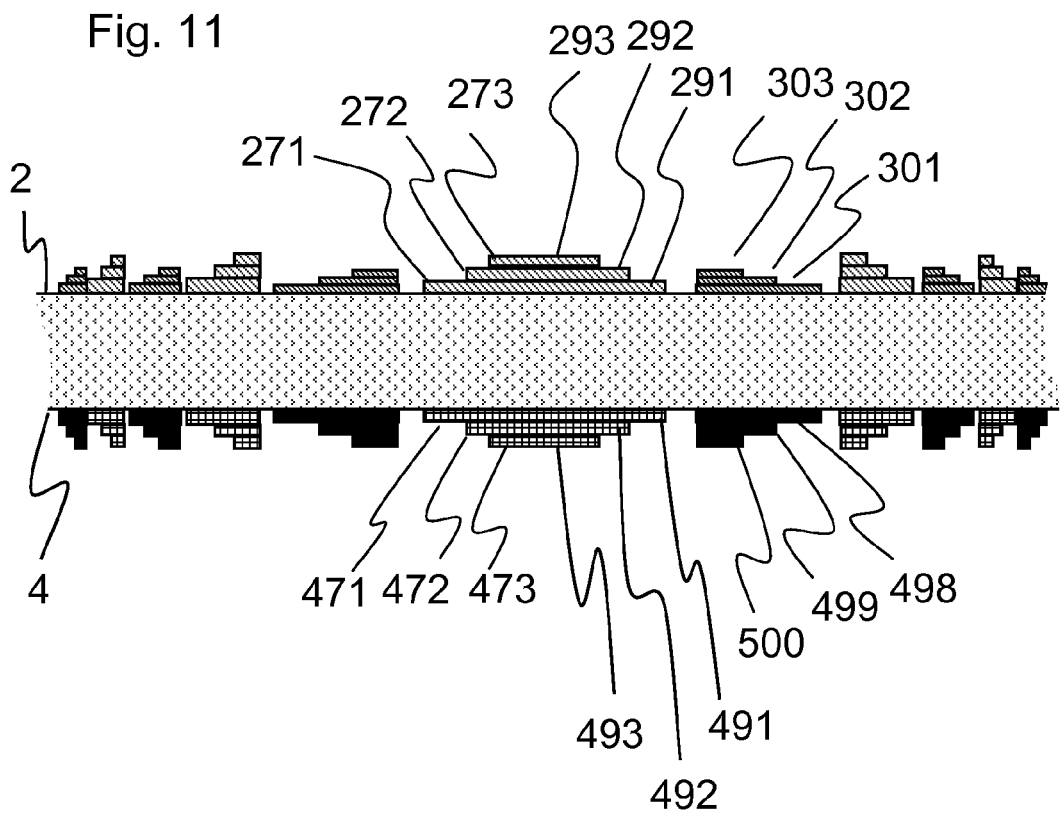

Further the embodiments illustrated in FIGS. 10 and 11 show exemplary a multiple layer system, in particular a three layer system, comprising a top side first layer 271, a top side second layer 272 and a top side third layer 273, which are placed on the top side 2 of the substrate 1 and a bottom side first layer 471, a bottom side second layer 472 and a bottom side third layer 473, which are placed on the bottom side 4 of the substrate 1.

FIG. 10 illustrates a system wherein the layer system on the top side of the substrate 1 is formed according to the layer system described in FIG. 8 and comprises a first and a second material. In particular the material of the positive structures 291, 292, 293, 298, 299, 300 is alternating. In detail, the positive structures 291, 292, 293 comprise in each layer 271, 272, 273 the same first material and the positive structures 298, 299, 300 comprise in each layer 271, 272, 273 the same second material. The three layer system on the bottom side 4 of the substrate 1 comprises positive structures 491, 492, 493, 498, 499, 500 of different materials, in particular the material of the positive structures 491, 492, 493, 498, 499, 500 is alternating. In detail, the positive structures 491, 492, 493 comprise in each layer 471, 472, 473 the same third material and the positive structures 498, 499, 500 comprise in each layer 471, 472, 473 the same fourth material.

FIG. 11 illustrates on the top side of the substrate 1 a three layer system 271, 272, 273 wherein the positive structures 291, 292, 293, 301, 302, 303 of each layer comprise different heights and materials.

The positive structures 291, 292, 293 comprise a first material and the positive structures 301, 302, 303 comprise a second material. More in detail, in the first layer 271 the positive structure 291 has a larger height than the positive structure 301, in the second layer 272 the positive structure 292 has a larger height than the positive structure 302 and in the third layer 273 the positive structure 293 has a larger height than the positive structure 303. In particular the height of the positive structures in each layer is alternating for neighbored positive structures. The layer system on the bottom side of the substrate 4 is formed according to the layer system on the bottom side 4 described in FIG. 10.

FIGS. 12 to 15 show plan views of further preferred embodiments of a Fresnel lens producible by the process according to the invention illustrating the preciseness which is achievable by the application of the above described process.

Figure 12:
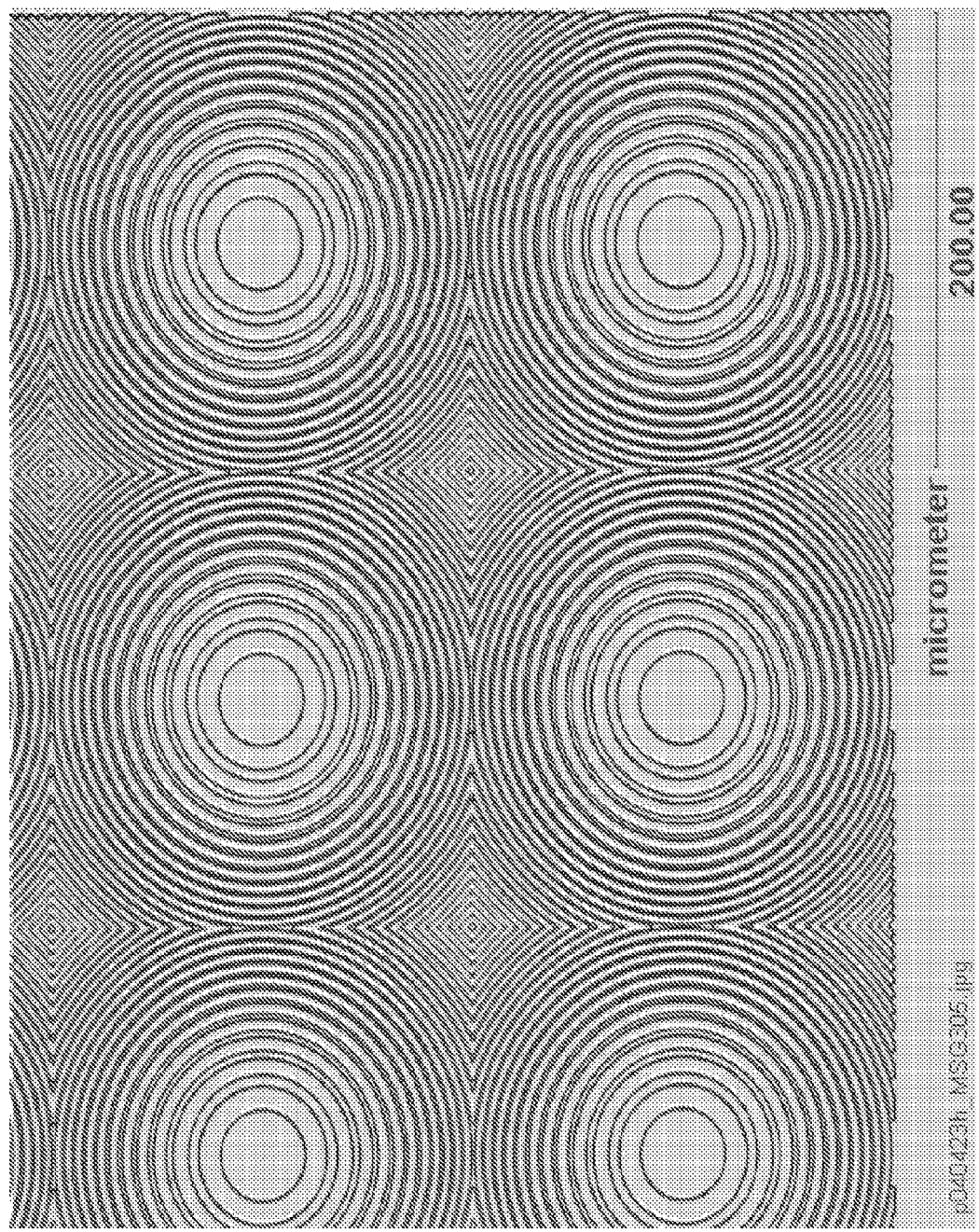
FIGS. 12 to 15 show diagrammatic plan views of further advantageous embodiments of a component according to the invention.
Figure 13:
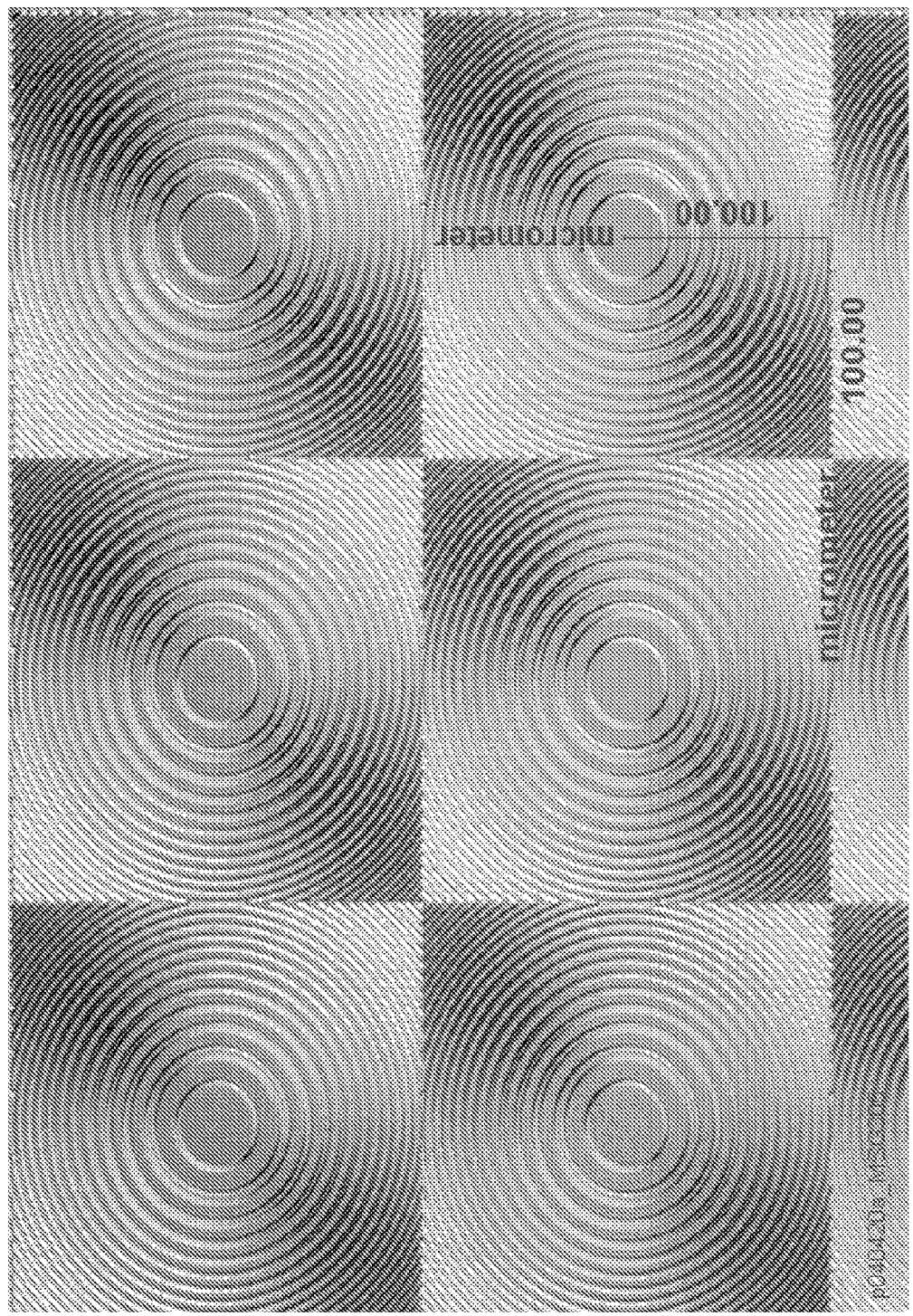
Figure 14:
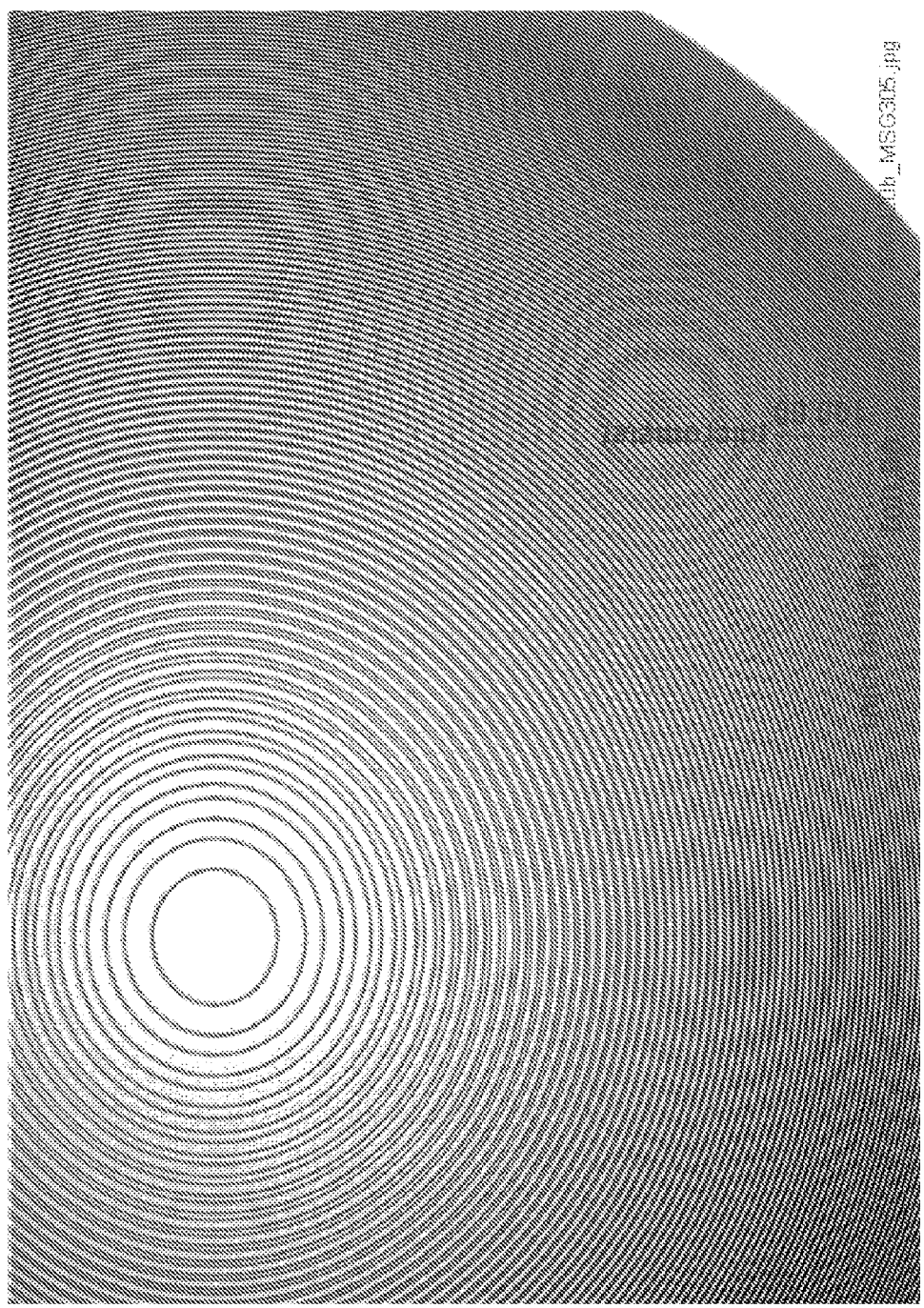
Figure 15:
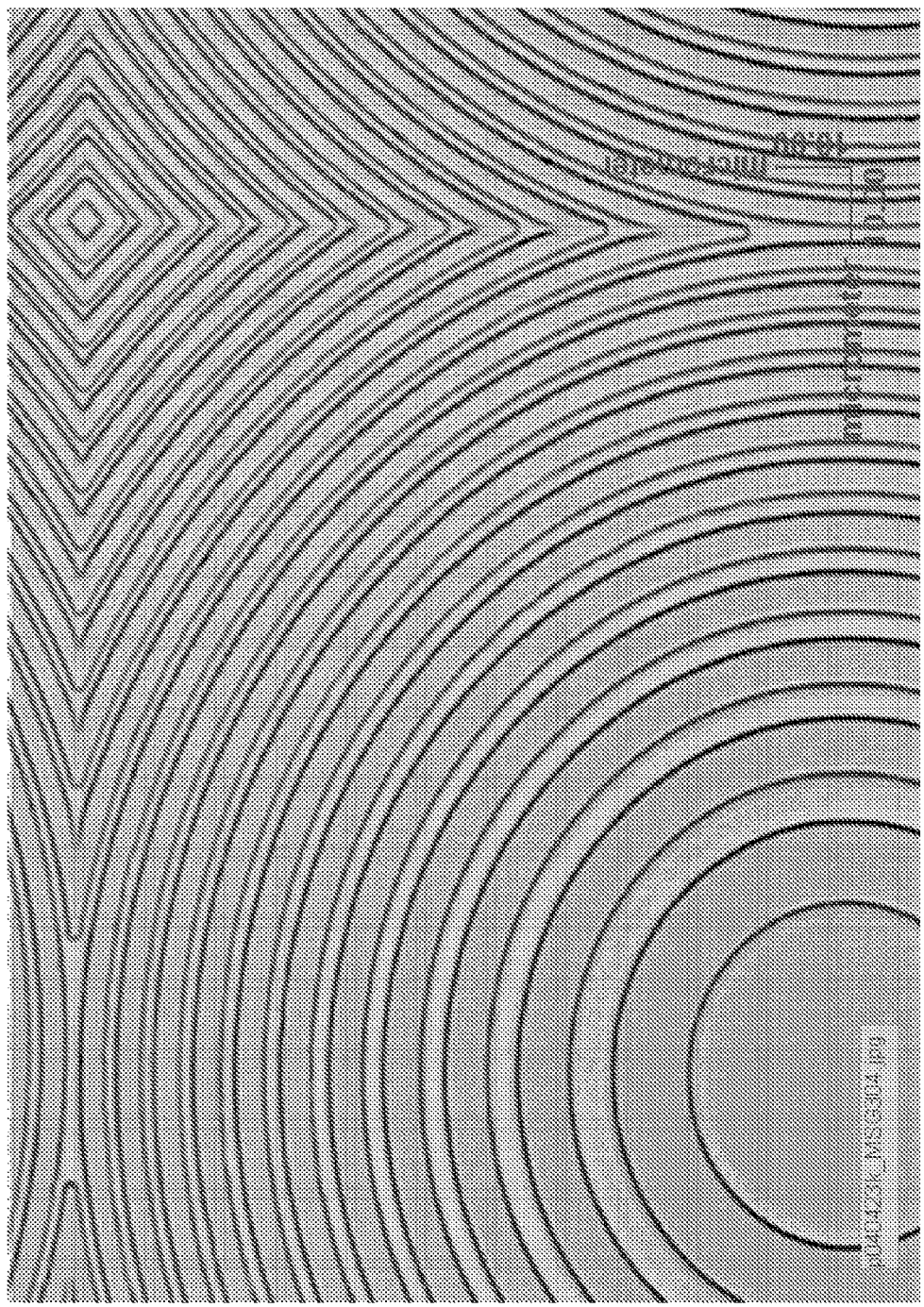

At least one optically active element, e.g. a Fresnel lens and/or a Fresnel lens type, could be placed on a substrate. This is illustrated in FIGS. 12 and 13 where several Fresnel lens are placed on a substrate respectively were fabricated on said substrate, e.g. provided as a wafer, simultaneously.

The present invention application therefore describes an application of the process for producing diffractive optical elements.

The present process describes the structured application of glass and metal layers to semiconductor, glass, ceramic and plastic substrates.

The structuring of the layers may be effected by resist layer photolithography.

The insulating glass layers are preferably realized by thermal or electron beam evaporation of suitable glass systems.

One advantage of the process described is the application of the insulating glass layer at room temperature up to at most 150° C., in which temperature range there is unlikely to be any damage to the substrate or the previously applied metal structures.

Suitable selection of the vapor deposition parameters of a glass which is preferably used with set optical and thermo-mechanical properties in this way makes it possible to apply structured glass layers with a thickness of between 0.1 µm and at most 1 mm.

The vapor deposition process by means of electron beam has been well known for years but has hitherto been used mainly for the mechanical and optical surface treatment of plastic/glass spectacles.

Schott Glas has been supplying the glass targets required for this purpose for about 30 years.

High vapor deposition rates of at most 4 µm/min are known from the data sheet of the known vapor-deposition glass 8329 (degassed Duran) and have been confirmed by a technical inquiry with the customer/manufacturer of sputtering installations.

This exceeds known sputtering rates by a multiple and makes the use of this process for the application described above of considerable interest.

Sputtered layers formed from single-component systems (preferably $SiO_2$) which have previously been applied have sputtering rates of a few nanometers per minute.

Another advantage of the evaporation deposition beside a high deposition rate is a lower thermal stress of the substrate which enables the possibility of using a photo resist to form the first coating.

The following parameters are greatly preferred for the application of a structured glass layer to substrates:
surface roughness of the substrate:
<50 µm
BIAS temperature during the evaporation:
≈100° C.
pressure during the evaporation:
$10^{-5}$ mbar
CTE of vapor-deposition glass and substrate coincide
The glass should have corresponding optical characteristic data.

For substrates such as silicon wafers or glass, such as Borofloat®33, according to current knowledge all these requirements are satisfied by the known SCHOTT vapor-deposition glasses (8329, G018-189) (cf. data sheet) which can be applied by suitable application processes, e.g. electron beam evaporation, to the above-mentioned substrates.

By using further suitable vapor-deposition glasses it is possible to extend the process to other substrates and to organic and inorganic semiconductors.

It will be apparent to a person skilled in the art that modifications to and variations of the above-described methods and apparatus are possible without departing from the inventive concept disclosed herein.

The invention claimed is:

1. A process for applying an optically active focusing structuring to a substrate, comprising structuring using photolithographic masks, wherein a central circular shaped uncovered region is surrounded by concentric ring area shaped uncovered regions, and wherein the structuring has a height of about 0.1 µm up to 10 mm, characterized by a number of repetitions of the steps of
   coating the substrate with a photosensitive resist layer while stepwise decreasing the width of a first layer structure to a top layer structure, wherein the step of coating the substrate is carried out by at least one of spin coating, spraying, and electrodeposition,
   photolithographic structuring of the applied layer,
   coating the pre-structured substrate with an optically active layer which comprises glass, by PVD (physical vapor deposition), wherein at least two glasses comprising different optical properties are used for the layer to enable the correction of the chromatic aberration, and
   lifting off the resist layer, wherein the step of lifting off the resist layer is carried out in such a manner that at least one layer that has been applied to the resist layer is also lifted off.

2. The process as claimed in claim 1, wherein the optically active structuring is applied onto at least one of (i) a bottom side of said substrate and (ii) a top side of said substrate.

3. The process as claimed in claim 1, wherein the coating step comprises the coating of the pre-structured substrate with an optically active layer by an evaporation deposition.

4. The process as claimed in claim 1, wherein the coating step comprises the coating of the pre-structured substrate with an optically active layer by E-beam PIAD processes.

5. The process as claimed in claim 1, wherein the photolithographic structuring step comprises mask exposure and subsequent developing.

6. The process as claimed in claim 1 wherein the optically active layer is applied such that the optically active layer comprises a varying layer composition along at least one of (i)

a direction perpendicular to a substrate surface and (ii) a direction parallel to the substrate surface.

7. The process as claimed in claim 1, wherein the optically active layer is applied with the aid of electron beam evaporation in the PVD process.

8. An optically active element comprising a substrate and at least one optically active first layer provided on said substrate;
   wherein the first layer is formed of at least one material selected from the group consisting of glass and metal, and has an optically active structure,
   wherein the optically active structure is produced using a process comprising structuring using photolithographic masks,
   wherein a central circular shaped uncovered region is surrounded by concentric ring area shaped uncovered regions, and
   wherein said structuring has a height of about 0.1 µm up to 10 mm, characterized by a number of repetitions of the steps of
      coating the substrate with a photosensitive resist layer while stepwise decreasing the width of a first layer structure to a top layer structure, wherein the step of coating the substrate is carried out by at least one of spin coating, spraying, and electrodeposition,
      photolithographic structuring of the applied layer,
      coating the pre-structured substrate with an optically active layer which comprises glass, by PVD (physical vapor deposition), wherein at least two glasses comprising different optical properties are used for the layer to enable the correction of the chromatic aberration, and
      lifting off the resist layer, wherein the step of lifting off the resist layer is carried out in such a manner that at least one layer that has been applied to the resist layer is also lifted off.

9. The optically active element as claimed in claim 8, wherein the optically active first layer is applied onto at least one of (i) a bottom side of said substrate and (ii) a top side of said substrate.

10. The optically active element as claimed in claim 8, wherein the optically active first layer has a thickness of between around 0.1 µm and at most 1 mm.

11. The optically active element as claimed in claim 8, wherein the optically active first layer has a width of smaller than around 50 µm.

12. The optically active element as claimed in claim 8, wherein the optically active first layer comprises a varying material composition along at least one of (i) a direction perpendicular to a substrate surface and (ii) a direction parallel to the substrate surface.

13. The optically active element as claimed in claim 8, wherein the coating of the pre-structured substrate with an optically active layer is applied by an evaporation deposition.

14. The optically active element as claimed in claim 8, wherein the coating of the pre-structured substrate with an optically active layer is applied by E-beam PIAD processes.

15. The optically active element as claimed in claim 8, wherein the photolithographic structuring comprises mask exposure and subsequent developing.

16. The optically active element as claimed in claim 8, wherein the optically active element is provided with an array of several optically active layers.

17. The optically active element as claimed in claim 16, wherein the array of several optically active layers comprise in each optically active layer the same material or different materials.

18. The optically active element as claimed in claim 8, wherein the optically active layer is applied with the aid of electron beam evaporation in the PVD process.

19. The optically active element as claimed in claim 8, wherein the optically active element is a Fresnel lens.

20. A component having an optically active structure comprising glass;
   wherein a first layer is formed of glass, and comprises an optically active structure,
   wherein the optically active structure is produced using a process comprising structuring using photolithographic masks,
   wherein a central circular shaped uncovered region is surrounded by concentric ring area shaped uncovered regions, and
   wherein said structuring has a height of about 0.1 µm up to 10 mm,
   wherein the structure is produced by:
      coating a substrate with a photosensitive resist layer while stepwise decreasing the width of a first layer structure to a top layer structure, wherein the step of coating the substrate is carried out by at least one of spin coating, spraying, and electrodeposition,
      photolithographic structuring of the applied layer,
      coating the pre-structured substrate with an optically active layer which comprises said glass, by PVD (physical vapor deposition), wherein at least two glasses comprising different optical properties are used for the layer to enable the correction of the chromatic aberration, and
      lifting off the resist layer, wherein the step of lifting off the resist layer is carried out in such a manner that at least one layer that has been applied to the resist layer is also lifted off.

21. The component as claimed in claim 20, wherein said component is a Fresnel lens.

22. A hybrid lens comprising a substrate and an optically active structure;
   wherein a first layer is formed of glass, and comprises an optically active structure,
   wherein the optically active structure is produced using a process comprising structuring using photolithographic masks,
   wherein a central circular shaped uncovered region is surrounded by concentric ring area shaped uncovered regions, and
   wherein said structuring has a height of about 0.1 µm up to 10 mm,
   wherein the hybrid lens is produced by:
      coating the substrate with a photosensitive resist layer while stepwise decreasing the width of a first layer structure to a top layer structure, wherein the step of coating the substrate is carried out by at least one of spin coating, spraying, and electrode position,
      photolithographic structuring of the applied layer,
      coating the pre-structured substrate with an optically active layer which comprises glass, by PVD (physical vapor deposition), wherein at least two glasses comprising different optical properties are used for the layer to enable the correction of the chromatic aberration, and
      lifting off the resist layer, wherein the step of lifting off the resist layer is carried out an such a manner that at least one layer that has been applied to the resist layer is also lifted off.

* * * * *